United States Patent
Mitros et al.

(10) Patent No.: US 6,873,021 B1
(45) Date of Patent: Mar. 29, 2005

(54) MOS TRANSISTORS HAVING HIGHER DRAIN CURRENT WITHOUT REDUCED BREAKDOWN VOLTAGE

(75) Inventors: Jozef C. Mitros, Dallas, TX (US); Imran Khan, Richardson, TX (US); Taylor R. Efland, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/725,641

(22) Filed: Dec. 2, 2003

(51) Int. Cl.$^7$ .............................................. H01L 29/76
(52) U.S. Cl. ..................... 257/409; 257/333; 257/335; 257/336; 257/339; 257/395; 257/396; 257/408
(58) Field of Search .............................. 257/333–339, 257/395, 396, 401, 408, 409

(56) References Cited

U.S. PATENT DOCUMENTS

| | | | | |
|---|---|---|---|---|
| 5,627,394 A | * | 5/1997 | Chang et al. ................ | 257/335 |
| 6,521,946 B2 | * | 2/2003 | Mosher ....................... | 257/336 |
| 6,548,874 B1 | * | 4/2003 | Morton et al. ............... | 257/371 |
| 2004/0173859 A1 | * | 9/2004 | Hao et al. ................... | 257/408 |

* cited by examiner

*Primary Examiner*—Tom Thomas
*Assistant Examiner*—Matthew E. Warren
(74) *Attorney, Agent, or Firm*—W. James Brady, III; Frederick J. Telecky, Jr.

(57) ABSTRACT

A drain-extended MOS transistor in a semiconductor wafer (300) of a first conductivity type comprises a first well (315) of the first conductivity type, operable as the extension of the transistor drain (305) of the first conductivity type, and covered by a first insulator (312) having a first thickness, and further a second well (302) of the opposite conductivity type, intended to contain the transistor source (304) of the first conductivity type, and covered by a second insulator (311) thinner than said first insulator (312). First and second wells form a junction (330) that terminates (320, 321) at the second insulator. The first well has a region (360) in the proximity of the junction termination, which has a higher doping concentration than the remainder of the first well and extends not deeper than the first insulator thickness. Region (360) of higher doping concentration reduces the transistor drain resistance so that the drain current is increased to approximately twice the value it had without the higher doping concentration, while the transistor breakdown voltage remains determined by the (low) doping concentration of the remainder of first well (315).

20 Claims, 6 Drawing Sheets

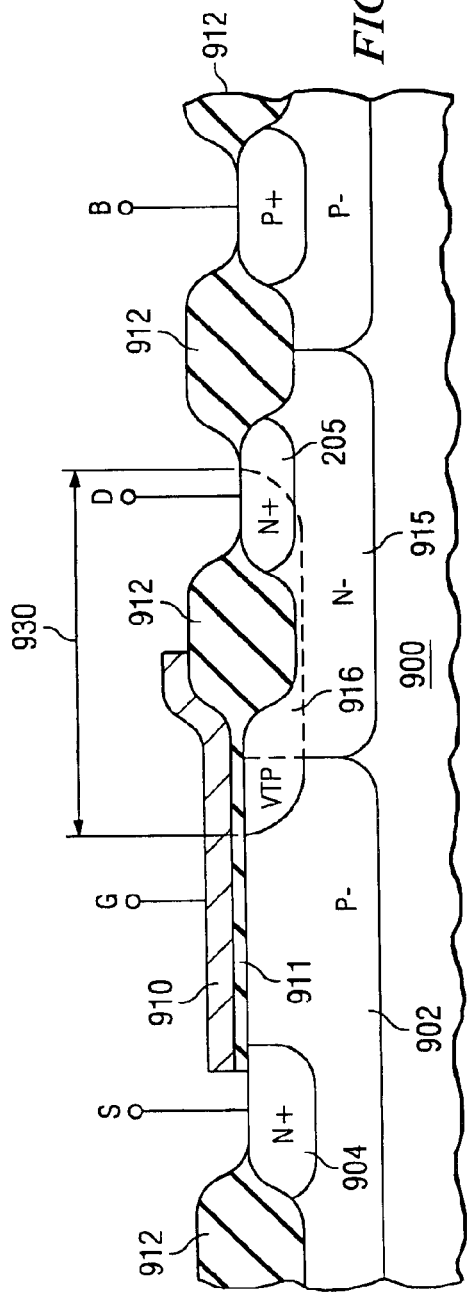
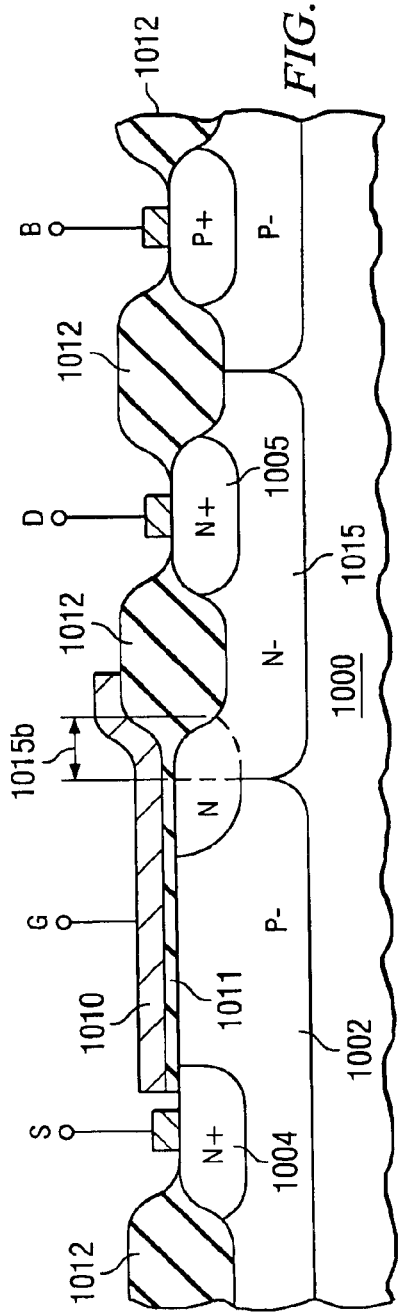

MOS TRANSISTORS HAVING HIGHER DRAIN CURRENT WITHOUT REDUCED BREAKDOWN VOLTAGE

FIELD OF THE INVENTION

The present invention is related in general to the field of electronic systems and semiconductor devices and more specifically to integrated circuits with MOS transistors having reduced drain resistance and higher drain current without reduced breakdown voltage.

DESCRIPTION OF THE RELATED ART

Among the ongoing trends in the semiconductor device industry are the efforts to reduce the cost and the power consumption of the fabricated devices, to increase the speed of the devices, and to integrate different device types on a single substrate. Foremost among the cost reduction efforts is the drive to miniaturize the components, especially by reducing the area, which these components consume; in addition, it is desirable to use a single process to fabricate both low-voltage, high-speed devices with higher power, higher-voltage devices.

Some of these efforts run into contradictions or undesirable side effects. For example, integrated circuits for power management require high voltage, low resistance MOS transistors. These transistors are typically of the drain-extended type and require large areas; this need thus conflicts with the desire for area reduction. Consequently, the goal is to create a drain-extended MOS transistor having the same drain current yet smaller area and unchanged breakdown voltage.

Drain-extended MOS transistors have been used to provide transistors with higher power and higher voltage. An example of a conventional drain-extended MOS transistor is depicted in FIG. 1. For illustration purposes, a p-channel transistor is selected in FIG. 1; it should be stressed, however, that analogous considerations hold for n-channel transistors. Typically, an isolation structure 112, which may be comprised of a field oxidation region (as shown) or a shallow trench isolation structure (STI), is formed under the gate electrode 110 so as to increase the breakdown voltage between source region 104 and drain region 105. Gate electrode 110 overlaps by length 110b over field oxide 112; the remaining length 110a is over gate oxide 111. Well region 115 (which is doped to be p-type for an p-channel transistor and n-type for a n-channel transistor) is formed to encompass region 105. Region 115 will form the drain extension. Region 115a, protected by the field oxide 112, defines the transistor breakdown voltage. The junction between well region 115 and well region 102 intersects the gate oxide 111 at location 120, defining the length 115b of well 115 under the gate oxide 111. The length 115a plus the length 115b define the drain resistance. In order to achieve a high enough breakdown voltage, the drain resistance typically has a high value. A problem with this conventional structure is that the drain resistance limits the drain current so that a larger drain current requires a larger transistor area, unless the breakdown voltage would be compromised.

A need has therefore arisen to develop a fabrication process and a structure, which concurrently provide a higher drain current and maintain the high breakdown voltage. The methodology should preferably be compatible with CMOS technology practices and not require additional mask steps, so that the methodology will remain cost effective. The fabrication method should be flexible enough for different semiconductor product families and a wide spectrum of design and process variation, especially for power transistors and transistors with low leakage current. Preferably, these innovations should be accomplished without extending the production cycle time and produce devices with high reliability and mechanical stability, and using the installed equipment, so that no investment in new manufacturing machines is needed.

SUMMARY OF THE INVENTION

One embodiment of the invention is a drain-extended MOS transistor in a semiconductor wafer of a first conductivity type, which comprises a first well of the first conductivity type, operable as the extension of the transistor drain of the first conductivity type, and covered by a first insulator having a first thickness. Further a second well of the opposite conductivity type, intended to contain the transistor source of the first conductivity type, and covered by a second insulator thinner than said first insulator. First and second wells form a junction that terminates at the second insulator. The first well has a region in the proximity of the junction termination, which has a higher doping concentration than the remainder of the first well and extends not deeper than the first insulator thickness. This region of higher doping concentration reduces the transistor drain resistance so that the drain current is increased to approximately twice the value it had without the higher doping concentration, while the transistor breakdown voltage (about 30 V or higher) remains determined by the (low) doping concentration of the remainder of first well.

As an example, the first conductivity type may be p-type and the opposite conductivity type may be n-type. The invention, however, is equally applicable for embodiments using the inverse conductivity selections.

In some embodiments, the transistor comprises in the wafer a buried layer of the opposite conductivity type, which separates the wells from the remainder of the wafer.

In another embodiment of the invention, a layer of epitaxial, low-doping-concentration semiconductor material of the first conductivity type is deposited before the steps of forming the wells. This lowly doped material provides an extra high transistor breakdown voltage (typically in the vicinity of 40 V).

Embodiments of the present invention are related to all pMOS and nMOS transistors used in integrated circuits (ICs) for linear, mixed signal and high precision analog devices. These ICs are manufactured with CMOS and Bi-CMOS technologies, and are employed in devices for many voltage group, such as 5 V, 8 V, 12 V products, and higher. Ics of these product families are found in telephones, printers and many other products of our information age. It is a technical advantage that the invention offers devices with higher current yet unchanged high breakdown voltages at basically no extra fabrication cost. Additional technical advantages include the opportunity to scale the devices to smaller dimensions, supporting the ingoing trend of IC miniaturization.

The technical advantages represented by certain embodiments of the invention will become apparent from the following description of the preferred embodiments of the invention, when considered in conjunction with the accompanying drawings and the novel features set forth in the appended claims.

BRIEF DESCRIPTION OF THE DRAWINGS

FIG. 9 is a schematic cross section of a portion of an integrated circuit with a drain-extended nMOS transistor showing the extent of an ion implant (VTP) according to the invention.

FIG. 10 is a schematic cross section of the same portion of an integrated circuit as in FIG. 3, showing a drain-extended nMOS transistor and the effect of an n-type ion implantation according to the invention.

DETAILED DESCRIPTION OF THE PREFERRED EMBODIMENTS

Figure 1:
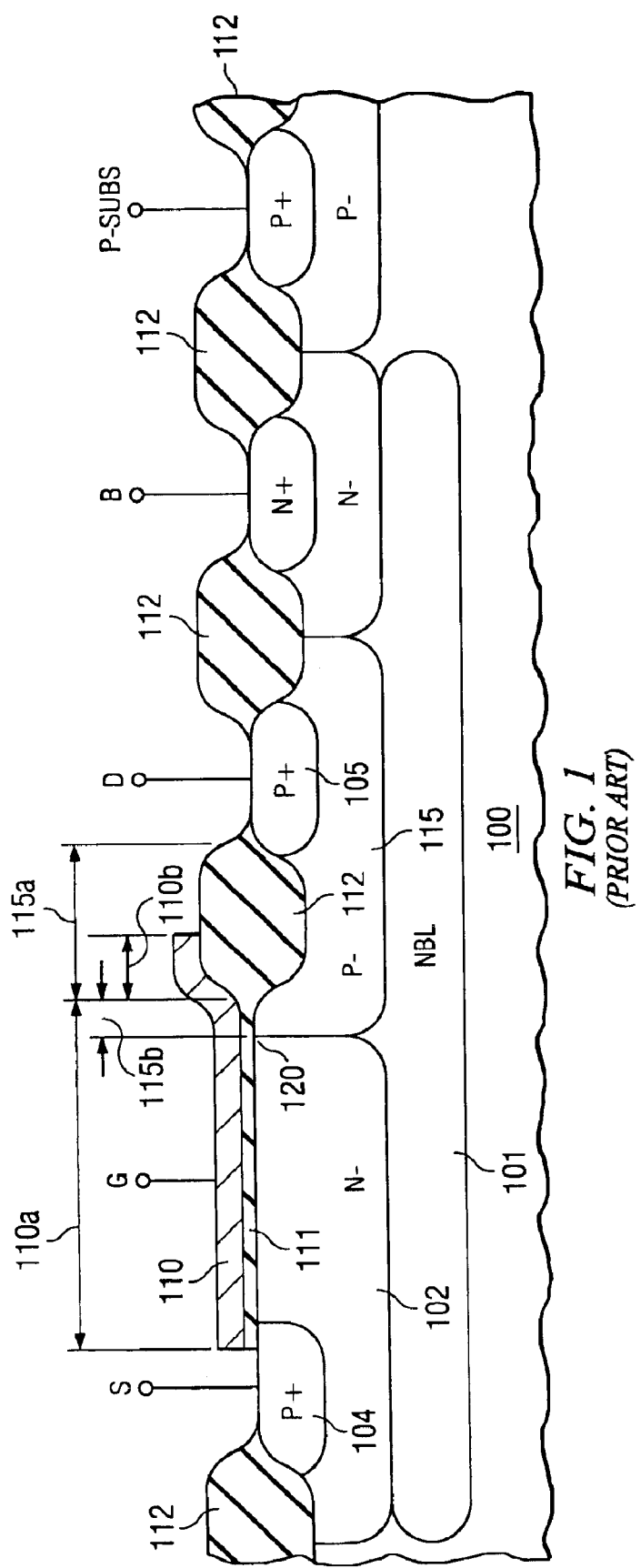
FIG. 1 is a schematic cross section of a portion of an integrated circuit with a high voltage drain-extended pMOS transistor in prior art.

The impact of the present invention can be best appreciated by comparing the embodiments of the present invention with the shortcomings of devices made with known technology. The schematic cross section of FIG. 1 shows a portion of an integrated circuit on a semiconductor chip including a drain-extended MOS transistor as fabricated by known technology. Since the example of FIG. 1 illustrates a p-channel MOS transistor, well region 115 is a p-doped well surrounding p+ drain 105, and well region 102 is an n-doped well, over which gate oxide 111 is located. It was pointed out above that well 102 and well 115 form a junction, which intersects with the gate oxide 111 at location 120, defining the length 115b of well 115 under the gate oxide 111. It was further pointed out that region 115a of well 115, protected by the field oxide 112, defines the transistor breakdown voltage, and that the length 115a plus the length 115b define the drain resistance.

Figure 2:
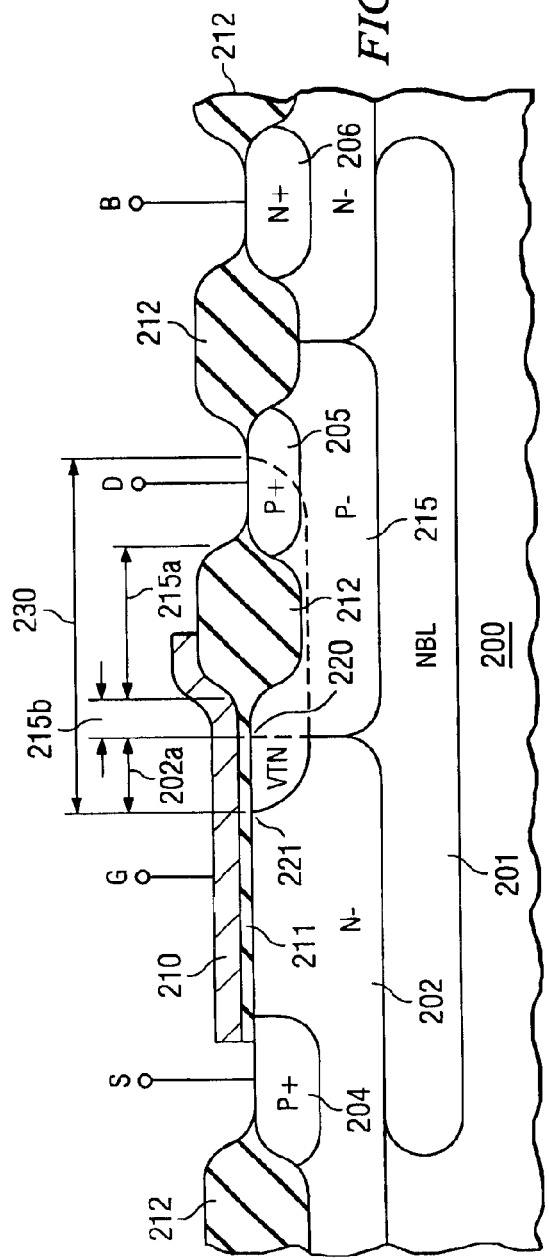
FIG. 2 is a schematic cross section of a portion of an integrated circuit with a drain-extended pMOS transistor, showing the extent of an ion implant (VTN) according to the invention.

The schematic cross section of FIG. 2 illustrates an embodiment of the present invention comprising a one-sided p-channel drain-extended pMOS transistor. An n-type buried layer 201 separates the transistor region from the p-type substrate 200. Well region 215 is a p-doped well surrounding p+ drain 205, and well region 202 is an n-doped well, over which gate oxide 211 is located. The n-well is contacted by body contact 206 (also referred to as back gate BG). P+ source 204 is located in n-well 202. Well 202 and well 215 form a junction, which intersects with the gate oxide 211 at location 220, defining the length 215b of well 215 under the gate oxide 211. Region 215a of well 215, protected by the field oxide 212, defines the transistor breakdown voltage, and the length 215a plus the length 215b define the drain resistance. In this embodiment of the invention, the drain resistance is reduced by a p-type implant into a portion of the p-well region. The extent of the implant is designated 230 in FIG. 2.

The implant is performed concurrently with an implant already being performed and thus does not represent an additional process step, but is fully integrated in the existing process flow. For p-type implants, boron is the preferred doping species. Frequently, such implants are performed for threshold voltage (VT) adjustment and are thus referred to as VT adjust implants (in FIG. 2, VTN threshold voltage n-type). In the embodiment of the present invention, however, the goal is to exploit the higher p-type doping in the region 215b, resulting from the additional boron implant, to reduce the drain resistance of the pMOS transistor, and thus allow a higher drain current. For instance, in some devices the current is increased from about 56 $\mu$A/$\mu$m to about 117 $\mu$A/$\mu$m. The implant energy is selected low enough so that the ions do not penetrate through the field oxide 212; consequently, the additional implant is self-aligned due to the field oxide.

It is a side effect that the extent of the p-type implant alters the junction between the p-well and the n-well in the sense that, by doping inversion in the affected portion of the n-well 202, the original junction intersection 220 with the gate oxide 211 has now moved by length 202a in the direction into the n-well towards the new intersect location 221. As stated above, this shift does not alter the transistor breakdown voltage, which remains a high breakdown voltage.

Another technical advantage of the invention becomes evident from the fact that the extent of length 215b can be considered as an effect of process tolerance, causing some uncertainty about the size of the high resistance region of the p-well 215. The VT adjust implant, however, strongly reduces the resistance of the process tolerance region 215b and thus renders the high resistance region in p-well 215 exact, eliminating the resistance uncertainty. The drain extension for drain 305 is now exactly the length 215a of the field oxide, a fact which amount to a smaller size of the MOS device. This technical advantage of the invention strongly supports the general miniaturization trend of the semiconductor technology.

While the device illustrated in FIG. 2 is a pMOS device, other embodiments of the invention employ nMOS devices, since the invention is equally applicable to pMOS and nMOS devices. One of ordinary skill in the art should realize, based on the instant recitations, which dopants and doping levels to use to convert the invention so as to be applicable to nMOS type devices. The result of the additional n-type implant is a lower drain resistance of the nMOS transistor and thus a higher drain current, while the transistor breakdown voltage remains high.

Figure 3:
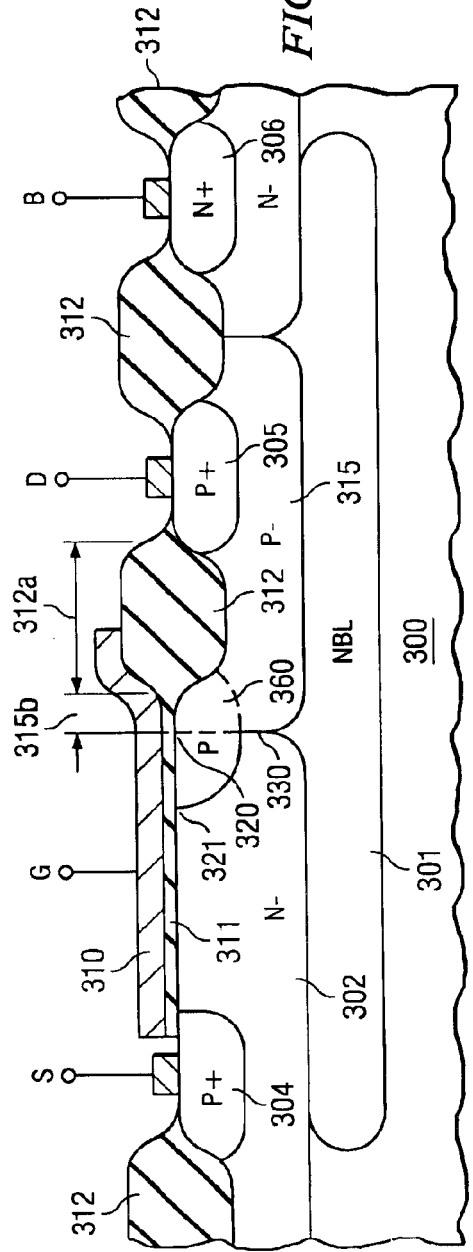
FIG. 3 is a schematic cross section of the same portion of an integrated circuit as in FIG. 2, showing a drain-extended pMOS transistor and the effect of a p-type ion implantation according to the invention.

FIG. 3 depicts in a schematic cross section the structure resulting from of the additional threshold voltage ion implant. As in FIG. 2, the example chosen refers to a one-sided p-channel drain-extended pMOS transistor in a p-type substrate 300 with an n-type buried layer 301; other embodiments of the invention use an analogous nMOS transistor (see FIGS. 9 and 10). Well region 302 is an n-doped well, over which gate oxide 311 is located. The thickness of gate oxide 311 is preferably 20 nm or less. Well region 315 is a p-doped well surrounding p+ drain 305, extending under the field oxide layer 312. The length 312a of the field oxide 312 determines exactly the drain extension and thus the breakdown voltage of the transistor and the resistance of the drain extension. The drain extension allows transistors with a breakdown voltage of about 30 V (for higher voltages see FIG. 8). Wells 315 and 302 form junction 330, which terminates at the surface at point 321 (before the additional doping in region 360 at point 320). The region 360 with the additional length 315b of the p-well 315 is heavily doped by the additional boron implant according to the invention and thus helps to reduce the overall drain resistance. The n-well is contacted by body contact 306. P+ source 304 is located in n-well 302. Well 302 and well 315 form a junction, which intersects with the gate oxide 311 at location 321.

Another embodiment of the present invention is a method for reducing the drain resistance of a drain-extended MOS transistor in a semiconductor wafer, while maintaining a high transistor breakdown voltage. One such method 400 is illustrated and described in FIG. 4, another method 600 is illustrated and described in FIG. 6. Although the exemplary methods 400 and 600 are illustrated and described as a series of acts or events, it will be appreciated that the present invention is not limited by the illustrated ordering of such acts or events, as some acts or events may occur in different orders and/or concurrently with other acts or events apart from those illustrated and described herein, in accordance with the invention. In addition, not all illustrated steps may be required to implement a methodology in accordance with the present invention. Moreover it will be appreciated that the method according to the present invention may be implemented in the fabrication of the semiconductor devices illustrated and described herein as well as in producing other devices not illustrated or described.

Figure 4:
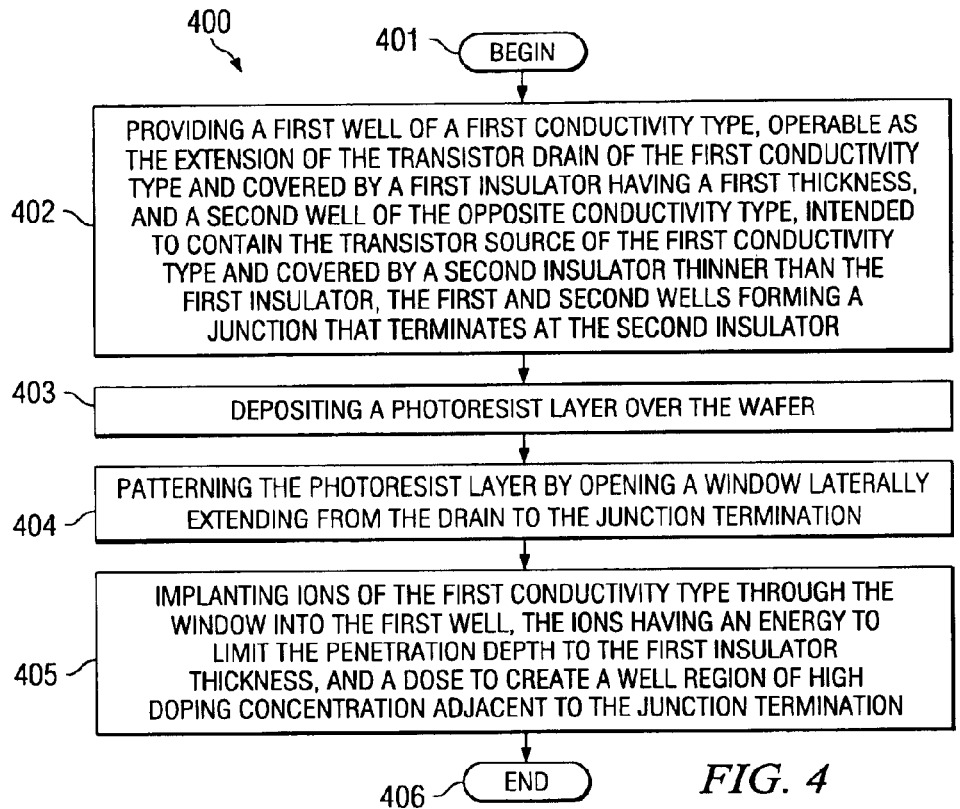
FIG. 4 is a process flow diagram illustrating an exemplary method of fabricating an MOS transistor in accordance with the present invention.

Beginning at step 401 in FIG. 4, the method 400 comprises providing at step 402 a well of a first conductivity type, operable as the extension of the transistor drain of the first conductivity type and covered by a first insulator having a first thickness. The first insulator thickness range is preferably from about 450 to 600 nm. Further provided is a well of the opposite conductivity type, intended to contain the transistor source of the first conductivity type and covered by a second insulator, which is thinner than the first insulator. The thickness of the second insulator is preferably in the range from 5 to 50 nm. The first and second wells form a junction that terminates at the second insulator.

At step 403, a photoresist layer is deposited over the MOS transistor. This photoresist layer is patterned at step 404 by opening a window, which extends laterally from the drain region to a distance in the second well slightly beyond the termination of the well junction at the second insulator.

At step 405, ions of the first conductivity type are implanted through the window into the first well. The ions have an energy so that their penetration is limited to approximately the thickness of the first insulator, and a dose so that the ions can create a region in the first well, adjacent to the junction termination, wherein the doping concentration is substantially higher than the original doping of the first well. This additional doping lowers the resistance in that region of the first well and thus permits a higher drain current to flow, without affecting the (high) breakdown voltage of the transistor.

Figure 5:
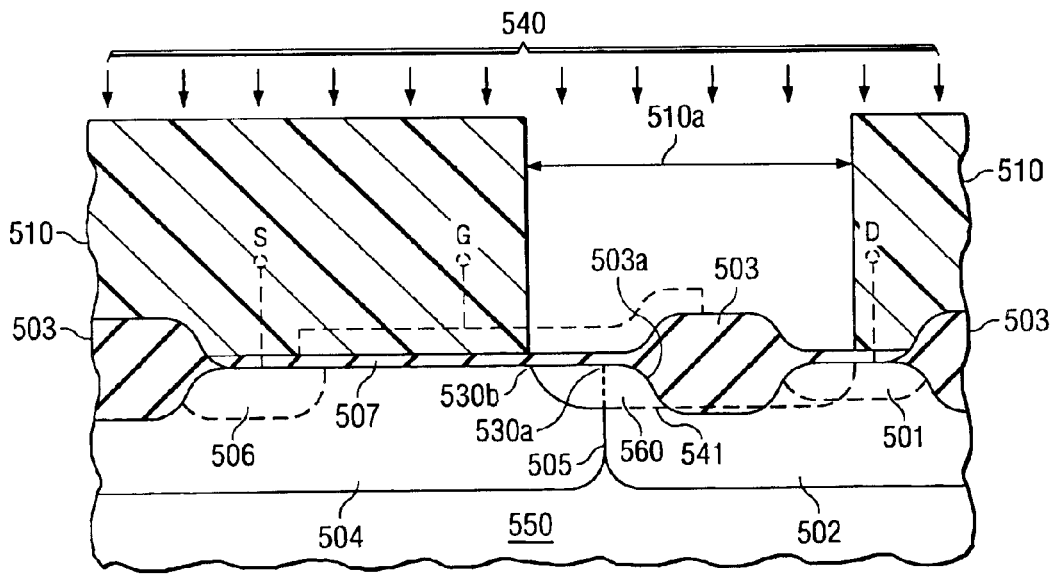
FIG. 5 is a schematic cross section of a portion of an integrated circuit with a drain-extended MOS transistor showing several process steps according to the present invention.

The main features and events of the method of FIG. 4 are schematically illustrated in FIG. 5. The region to be the transistor drain, designated 501, has a first conductivity type; it is surrounded by well 502 of the first conductivity type. The surface of well 502 is protected by first insulator 503, which has the thickness of a field insulator/oxide. The second well 504 of the opposite conductivity type forms a junction 505 with the well 502 and has a surface protected by second insulator 507, which has the thinness of a gate insulator/oxide. Junction 505 terminates at insulator 507 at point 530a. Region 506 of the first conductivity type, surrounded by well 504, is operable as the transistor source.

A photoresist layer 510 has a window of width 510a. Window 510a stretches from drain region 501 to a point 530b inside the well 504, slightly beyond junction termination 530a. Ions 540 of the first conductivity type are implanted though window 510a into well 502. The energy of the ions 540 is selected so that they penetrate to a boundary 541, which approximately coincides with the penetration depth of the insulator 503. Boundary 541, junction 505, and the border 503a of insulator 503 determine a volume 560 of well 502 material, which is heavily doped by ions 540. This additional doping lowers the electrical resistance in this region 560 of the first well 541 and thus permits the flow of a higher drain current—without affecting the magnitude of the transistor breakdown voltage. As far as the implanted ions 540 penetrate into well 504, they invert the well conductivity move the junction 505 from termination point 530a to point 530b.

When the semiconductor material 550 has the opposite conductivity type of the channel of the MOS transistor, it can directly serve as the substrate of the transistor. However, when material 550 has the same conductivity type as the channel, an early process step has to create a buried layer in the semiconductor material in order to separate the region in which the transistor is to be formed from the remainder of semiconductor material serving as substrate. As an exemplary embodiment, for a p-type substrate, an n-type implant (formed, for instance, by energetic, high dose antimony ions, followed by a drive-in) creates an n-type buried layer. On top of the buried layer may then be arranged either p-epitaxial and n-epitaxial semiconductor material, or a lightly doped n-well and s lightly-doped p-well.

Another embodiment of the present invention is a low-cost method 600 for fabricating, on the surface of a semiconductor wafer of a first conductivity type, an MOS transistor having a channel of the opposite conductivity type, a high breakdown voltage, and a high drain current. The fabrication steps are displayed in the block diagram of FIG. 6.

Figure 6:
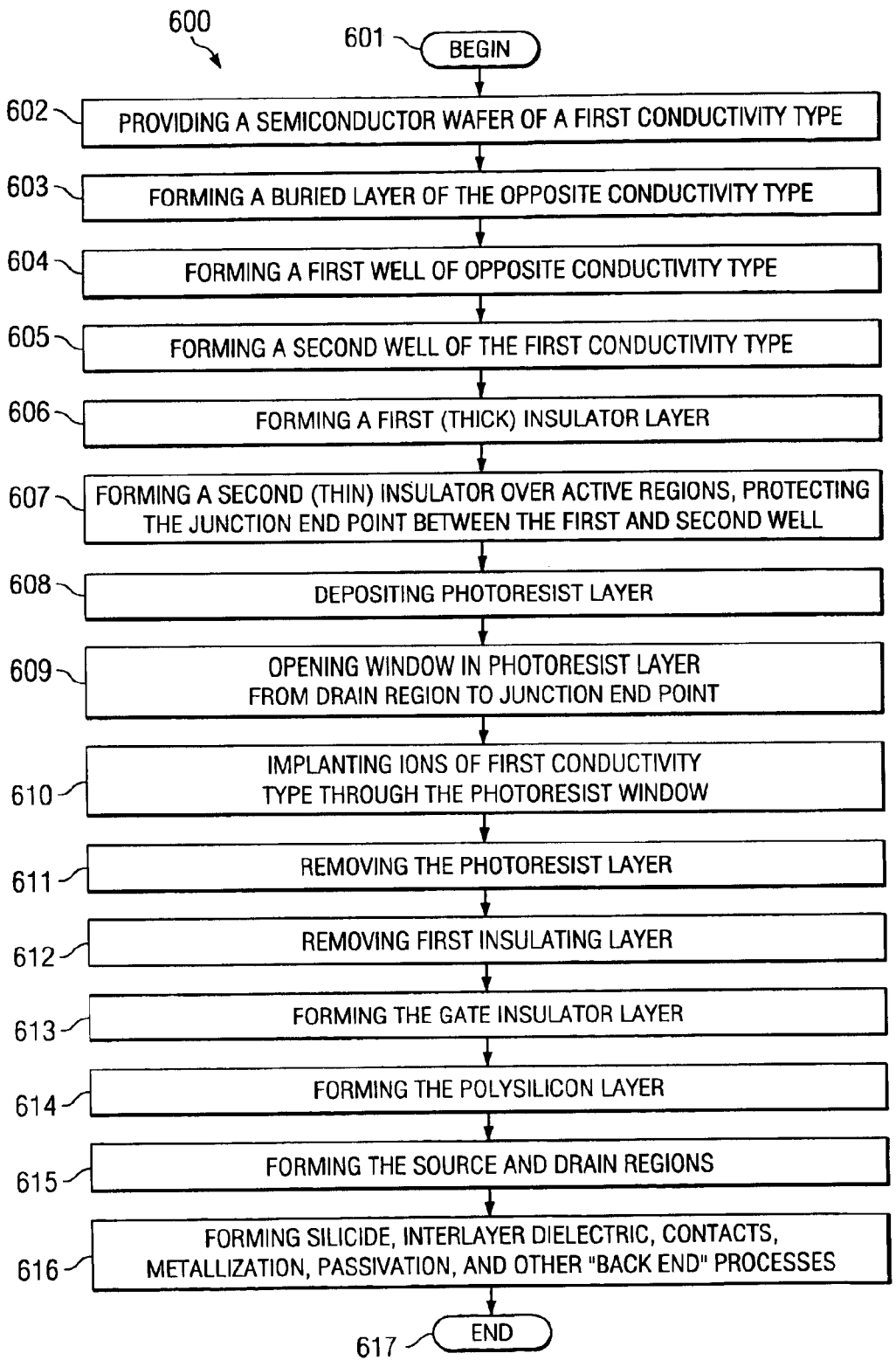
FIG. 6 is a process flow diagram illustrating another exemplary method of fabricating an MOS transistor in accordance with the present invention.

Beginning at step 601 in FIG. 6, the method 600 comprises providing at step 602 a semiconductor wafer of a first conductivity type. When a p-type silicon wafer, or epitaxial silicon, is chosen, a preferred resistivity of the wafer is in the range of about 13 $\Omega$cm. At step 603, a buried layer of the opposite conductivity type is formed in the semiconductor material of the first conductivity type, using standard ion implantation and diffusion procedures. At step 604, a first well is formed, which has opposite conductivity type; this well has a sidewall. For p-type starting wafers, the first well is n-type; it is preferably created by a phosphorus implant having an energy of about 900 keV, a dose of about 1E13/cm$^2$, creating a doping concentration between about 1E12 to 3E13/cm$^3$.

At step 605, a second well is formed, which has the first conductivity type, but at a low doping concentration. If the starting wafer also has the first conductivity type, an n-type buried layer has to be created before the formation of the second well, as described above. This buried layer separates the region of the wells from the starting wafer material. The second well preferably has a (boron) ion implantation of about 50 keV energy, $1E13/cM^2$ dose, and 1E12 to $3E13/cm^3$ concentration. It is the doping concentration of the second well, which determines the breakdown voltage of the MOS transistor. The second well has a sidewall so that a junction is formed with the sidewall of the first well; the junction terminates at the surface of the wafer.

At step 606, a first, thick insulator layer is formed over a portion of the second well; this insulator layer is thick enough to serve as the field insulator/oxide. A preferred thickness range of the first insulator is between 450 and 600 nm. At step 607, a second, thin insulator layer is formed over a portion of the first well; this second insulator layer is thin enough to be comparable to gate insulators; it protects the junction end point (termination) between the first and second wells. A preferred thickness range for the second insulator is between 5 and 50 nm.

At step 608, a photoresist layer is deposited over the wafer. Next, the photoresist layer is patterned in Step 609 by opening a window, which has a width at least about the length from the drain region to the region where the junction between the first and second wells terminates at the wafer surface. It is preferred that the window extends beyond this point a short distance into the region of the first well (which has the opposite conductivity type).

At step 610, ions of the first conductivity type are implanted through the photoresist window. These ions have an energy just high enough to penetrate to a depth about equal to the selected thickness of the first/field insulator, but not substantially deeper. With this energy, the ions can penetrate through the second, thin insulator into the region of the junction between the first and second wells. Especially, the ions have enough energy to penetrate into the second well in the vicinity of the junction so that they can enhance the doping of the first conductivity type in this part of the well.

The dose of the implanted ions is selected so that they create a region in the second well having a higher doping concentration than the remainder of the well. This region is adjacent to the junction between the two wells. Because of this enhanced doping, the electrical resistivity of this well region is reduced and the capability for higher drain current is enhanced.

Furthermore, if the photoresist window was opened so that it allowed the ion implant of the first conductivity type to penetrate into a certain region of the well of opposite conductivity type, adjacent to the junction, that region may invert its doping characteristic; the junction would shift a slight distance into the original well.

If the ion implant of the first conductivity type is p-type, a preferred implant selection is boron ions with an energy of about 15 to 25 keV and a dose in the approximate range from 2 to $6E11/cm^2$. If the ion implant is n-type, a preferred implant selection is phosphorus ions with an energy of about 40 to 60 keV and a dose in the approximate range from 1 to $3E12/cm^2$.

In step 611, the photoresist layer is removed. In step 612, the first insulator layer is removed, and in step 613, the actual gate insulator layer is formed over the first well so that the gate can be completed. A preferred thickness range for the gate insulator is 3 to 13 nm. In step 614, the source region is formed in the first well, and in step 615, the drain region is formed in the second well. Other front-end processing is performed at step 616, including forming metallization structures, silicides, and contacts, as well as forming other transistors and devices for the integrated circuit and multi-level structures, before the method 600 ends at step 617.

The methods of FIGS. 5 and 6 are flexible. For instance, the methods can be adjusted to different field oxide thicknesses, different ion implant conditions, and a number of variations in the sequence of process steps and additional process steps. In addition, the ion implant may be followed by selected anneal conditions. Further, different thicknesses or materials for the first insulator can be accounted for by changes in the ion implant selection. Also, the width of the photoresist window can be varied for specific device needs.

Figure 7:
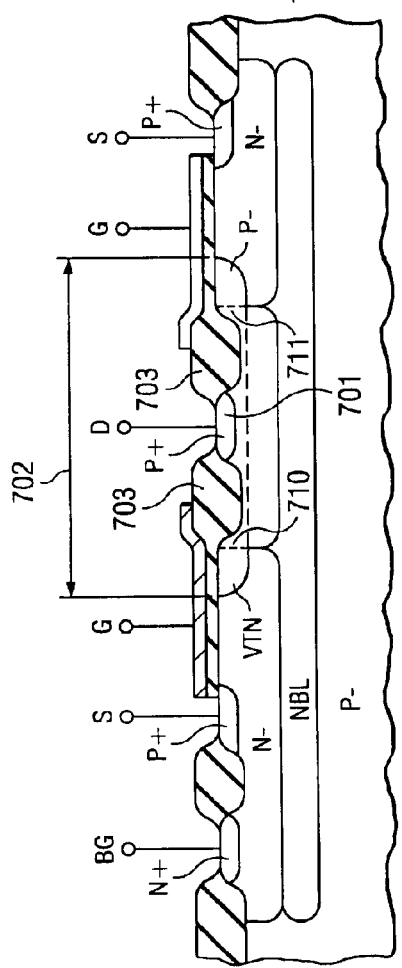
FIG. 7 is a schematic cross section of a portion of an integrated circuit with another drain-extended pMOS transistor, showing the extent of an ion implant (VTN) according to the invention.

Using the fabrication methods described in conjunction with FIGS. 5 and 6, numerous embodiments of the present invention can be manufactured. As an example, FIG. 7 illustrates a two-sided p-channel drain-extended pMOS transistor. The drain is designated 701. In another example, the drain side of the transistor may be configured in a circular structure, as a drain-centered drain-extended pMOS transistor. The extent of the ion implantation according to the invention, marked as VTN (n-type threshold voltage), is designated 702; the penetration of the implanted ions is indicated by dashed lines. The ions actually do not penetrate deeper than the thickness extent of the field oxide regions 703. The ion implantation is again self-aligned by the field oxide layers 703. The result of the ion implantation are the enhanced doping regions 710 and 711, which permit an increased drain current while the high breakdown voltage remains unchanged. With device configurations such as shown in FIG. 7, compact drain-extended pMOS transistors with about 30 V breakdown voltage for use as a power device or as a high side driving device in a low voltage high density process have been manufactured. The reduced drain resistance provides an approximate doubling of the current for the same size transistor—or, if desired, allows a reduction of the transistor size.

These advantages are obtained without an extra photomask step, since the required ion implantation had to be performed anyway for the fabrication of other device structures, such as channel stop and punch-through features. As an example, the p-type boron implants for controlling threshold voltage (VTN), punch-through and channel stop can be designed through the same photomask pattern. This process simplification saves design time and represents a cost reduction. Specifically, the VTN and punch-trough implants are low energy and are preformed after the field oxidation; they are, therefore, self-aligned to the field oxide region and photo-aligned to the active region. The channel stop implant is high energy and photo-aligned.

It will be obvious to somebody skilled in the art that analogous considerations can be applied to devices with inverse conductivity types. A VTP n-type implant may, for instance, be a phosphorus implant as mentioned above. In another embodiment, the method of the invention provides devices where at least the channel stop or the p-well implant is present and extends between the channel n-well region and the active drain p-region so as to connect the two regions as low resistance p-type under the field region.

Figure 8:
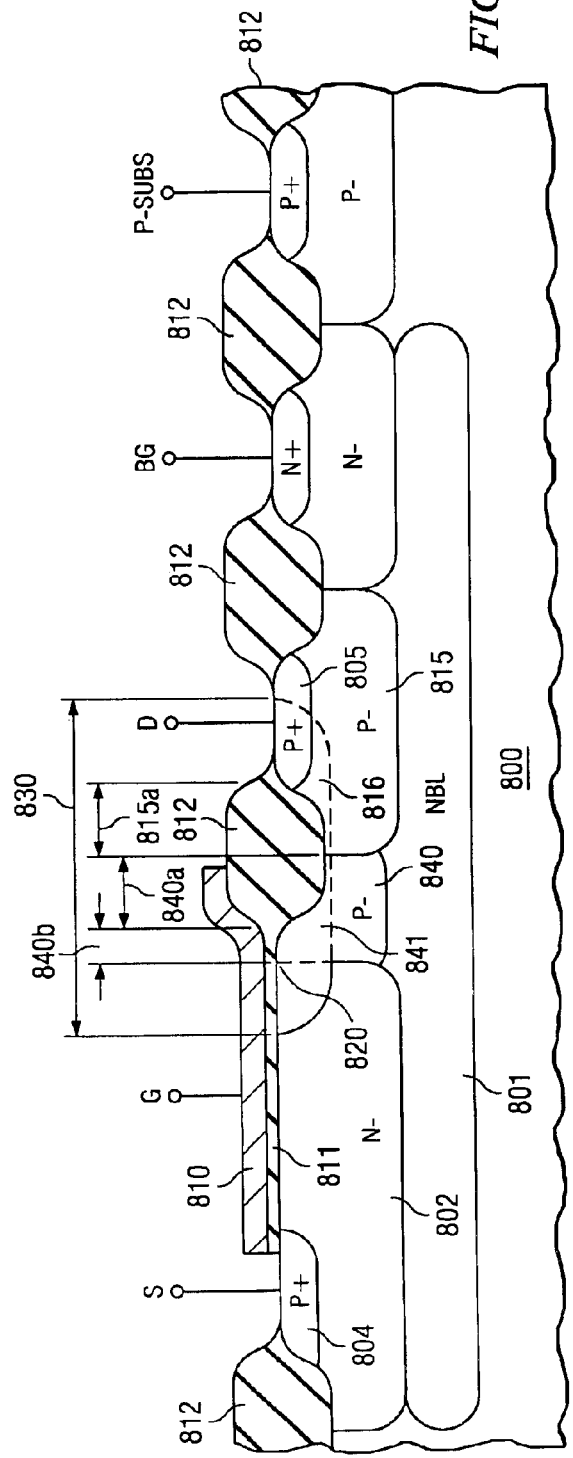
FIG. 8 is a schematic cross section of a portion of an integrated circuit with another drain-extended pMOS transistor, structured for very high breakdown voltages, showing the extent of an ion implantation according to the invention.

Another embodiment of the present invention, aiming at very high breakdown voltage transistors (such as >36 V) is schematically depicted in the cross section of FIG. 8. The device shown in FIG. 8 is for a one-sided p-channel drain-extended pMOS transistor on a p-type substrate, but analogous considerations hold for nMOS devices. An n-type buried layer 801 separates the transistor region from the p-type substrate 800. A p-type epitaxial layer 840 is formed over the n-buried layer 801. This epitaxial layer has low doping concentration to achieve a high transistor breakdown voltage. Into layer 840, the well regions are implanted and diffused. P-well region 815 surrounds p+ drain 805, and n-well region 802 surrounds p+ source 804; n-well 802 has gate insulator 811 over which the gate is built. Well 802 forms a junction with p-epitaxial layer 840, which intersects with the gate insulator 811 at location 820, defining the length 840b of the epitaxial layer 840 under the gate insulator 811. The other portion 840a of the epitaxial layer is protected by field insulator 812. Region 840a defines the transistor breakdown voltage; the sum of the electrical resistances of p-lengths 840a, 840b, and 815a defines the drain resistance.

In this embodiment of the invention, the drain resistance is reduced by a p-type implant into portion 816 of the p-well region and portion 841 of the p-epitaxial layer. The extent of the implant is designated 830 in FIG. 8. The reduction in drain resistance provides an approximate doubling of the drain current, while the transistor breakdown voltage remains essentially unchanged at typically >30 V or even >40 V. The p-type ion implant uses the same photomask window and alignment, which already needed for other process steps, such as channel stop implant at high energy (for example 180 keV), and punch-through implant at low energy (does not penetrate through field insulator, thus self-aligned to the field insulator and photo-aligned to the active regions). The p-type ion implant does, therefore, not increase the cost of process flow.

The embodiments of the instant invention shown in FIGS. 9 and 10 illustrate nMOS transistors formed in p-type substrate wafers 900; these embodiments are analogous to the embodiments discussed in FIGS. 2 and 3, without the need for buried layers. In FIG. 9, the drain resistance is reduced by an n-type implant into a portion of the n-well region 915. The implant is often referred to as VTP implant. The extent of the implant is designated 930 in FIG. 9. The energy of the implant is selected so that the ions do not penetrate beyond the limit of the field insulator/oxide. Especially in region 916 of n-well 915 is the electrical resistance reduced due to the increase in n-type doping concentration by the ion implant. The reduction in drain resistance provides an approximate doubling of the drain current, while the transistor breakdown voltage remains essentially unchanged.

The embodiment shown in FIG. 10 represents the structure of the one-sided n-channel drain-extended nMOS transistor in a p-type substrate resulting from the additional n-type implant in FIG. 9 (VTP implant). Large sections of the n-well 1015 are protected by the thick field insulator 1012. The additional length 1015b, however, of the n-well 1015 is located under the thin gate insulator 1011 and is thus heavily doped by the additional n-type (preferably phosphorus) implant according to the invention and thus helps to reduce the overall drain resistance, which enables an increase of the drain current by about a factor of two.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications and embodiments.

We claim:

1. A drain-extended MOS transistor in a semiconductor wafer of a first conductivity type, comprising:
    a first well of said first conductivity type, functioning as the extension of the transistor drain of said first conductivity type, and covered by a first insulator having a first thickness;
    a second well of the opposite conductivity type, containing a transistor source of said first conductivity type, and covered by a second insulator thinner than said first insulator, said first and second wells forming a junction that terminates at said second insulator;
    said first well having a region in the proximity of said junction termination, which has a higher doping concentration than the remainder of said first well and extends not deeper than said first insulator thickness.

2. The transistor according to claim 1 wherein said first insulator thickness is in the range from 450 to 600 nm.

3. The transistor according to claim 1 wherein said second insulator is less than 30 nm thick.

4. The transistor according to claim 3 wherein said second insulator thickness is in the range from 1 to 15 nm.

5. The transistor according to claim 1 wherein said first conductivity type is p-type and said opposite conductivity type is n-type.

6. The transistor according to claim 1 wherein said higher doping concentration in said first well region reduces the transistor drain resistance so that the drain current is increased to approximately twice the value it had without said higher doping concentration.

7. The transistor according to claim 1 wherein said doping concentration of said remainder of said first well determines the breakdown voltage of said transistor.

8. The transistor according to claim 1 further comprising in said wafer a buried layer of said opposite conductivity type, said layer separating said wells from the remainder of said wafer.

9. A drain-extended MOS transistor in a semiconductor wafer doped in a first conductivity type, comprising:
    a buried layer of the opposite conductivity type;
    an epitaxial layer on top of said buried layer, said epitaxial layer doped in said first conductivity type at a concentration lower than said wafer;
    a first well of said first conductivity type, functioning as the extension of the transistor drain of said first conductivity type;
    a second well of the opposite conductivity type, containing a transistor source of said first conductivity type, said second well forming a junction with said epitaxial layer, said junction terminating at the surface of said epitaxial layer;
    said first well and portions of said epitaxial layer covered by a first insulator having a first thickness;
    said second well and the remainder of said epitaxial layer covered by a second insulator thinner than said first insulator, said second insulator also protecting said junction termination;
    said epitaxial layer having a region in the proximity of said junction termination, which has a higher doping concentration than the remainder of said epitaxial layer and extends not deeper than said first insulator thickness.

10. The transistor according to claim 9 wherein said first insulator thickness is in the range from 450 to 600 nm.

11. The transistor according to claim 9 wherein said second insulator is less than 30 nm thick.

12. The transistor according to claim 11 wherein said second insulator thickness is in the range from 1 to 15 nm.

13. The transistor according to claim 9 wherein said first conductivity type is p-type and said opposite conductivity type is n-type.

14. The transistor according to claim 9 wherein said higher doping concentration in said epitaxial layer region reduces the transistor drain resistance so that the drain current is increased to approximately twice the value it had without said higher doping concentration.

15. The transistor according to claim 9 wherein said doping concentration of said remainder of said epitaxial layer determines the breakdown voltage of said transistor.

16. A drain-extended MOS transistor in a semiconductor wafer of a first conductivity type, comprising:
   a first well of the opposite conductivity type, functioning as the extension of the transistor drain of said opposite conductivity type, and covered by a first insulator having a first thickness;
   a second well of said first conductivity type, containing a transistor source of said opposite conductivity type, and covered by a second insulator thinner than said first insulator, said first and second wells forming a junction that terminates at said second insulator;
   said first well having a region in the proximity of said junction termination, which has a higher doping concentration than the remainder of said first well and extends not deeper than said first insulator thickness.

17. The transistor according to claim 16 wherein said first insulator thickness is in the range from 450 to 600 nm.

18. The transistor according to claim 16 wherein said second insulator thickness is less than 30 nm.

19. The transistor according to claim 18 wherein said second insulator thickness is in the range from 1 to 15 nm.

20. The transistor according to claim 16 wherein said first conductivity type is p-type and said opposite conductivity type is n-type.

* * * * *